United States Patent [19]
Tateyama et al.

[11] Patent Number: 5,339,128
[45] Date of Patent: Aug. 16, 1994

[54] RESIST PROCESSING METHOD

[75] Inventors: Kiyohisa Tateyama; Masami Akimoto, both of Kumamoto; Mitsuru Ushijima, Tama, all of Japan

[73] Assignees: Tokyo Electron Limited, Tokyo; Tokyo Electron Kyushu Limited, Kumamoto, both of Japan

[21] Appl. No.: 31,464

[22] Filed: Mar. 15, 1993

Related U.S. Application Data

[63] Continuation-in-part of Ser. No. 904,505, Jun. 25, 1992, Pat. No. 5,202,716, which is a continuation-in-part of Ser. No. 627,357, Dec. 14, 1990, Pat. No. 5,177,514, which is a continuation of Ser. No. 308,470, Feb. 10, 1989, Pat. No. 4,985,722.

[30] Foreign Application Priority Data

Feb. 12, 1988 [JP] Japan .................................. 63-30219
Nov. 5, 1991 [JP] Japan .................................. 3-318441

[51] Int. Cl.$^5$ .............................................. G03D 5/00
[52] U.S. Cl. ...................................... 354/317; 354/337
[58] Field of Search ............... 354/319, 320, 317, 322, 354/325, 330, 337; 414/225, 217, 222

[56] References Cited

U.S. PATENT DOCUMENTS

| | | | |
|---|---|---|---|
| 4,764,076 | 8/1988 | Layman et al. | 414/225 |
| 4,917,556 | 4/1990 | Stark | 414/217 |
| 4,985,722 | 1/1991 | Ushiyama et al. | 354/319 |
| 5,061,144 | 10/1991 | Akimoto et al. | 414/225 |
| 5,177,514 | 1/1993 | Ushiyama et al. | 354/319 |
| 5,202,716 | 4/1992 | Tateyama et al. | 354/319 |

FOREIGN PATENT DOCUMENTS 49-107678  10/1974  Japan .
61-56859   3/1986   Japan .
61-123150  6/1986   Japan .
63-13332   1/1988   Japan .

Primary Examiner—D. Rutledge
Attorney, Agent, or Firm—Oblon, Spivak, McClelland, Maier & Neustadt

[57] ABSTRACT

A resist process system of the present invention includes at least two robots for conveying a wafer, a passage through which the robots can move, plural process units arranged along the passage, and a waiting unit for temporarily holding the wafer which is to be processed. The waiting unit is arranged beside the passage and between the process units and it includes plural compartments partitioned in it.

30 Claims, 11 Drawing Sheets

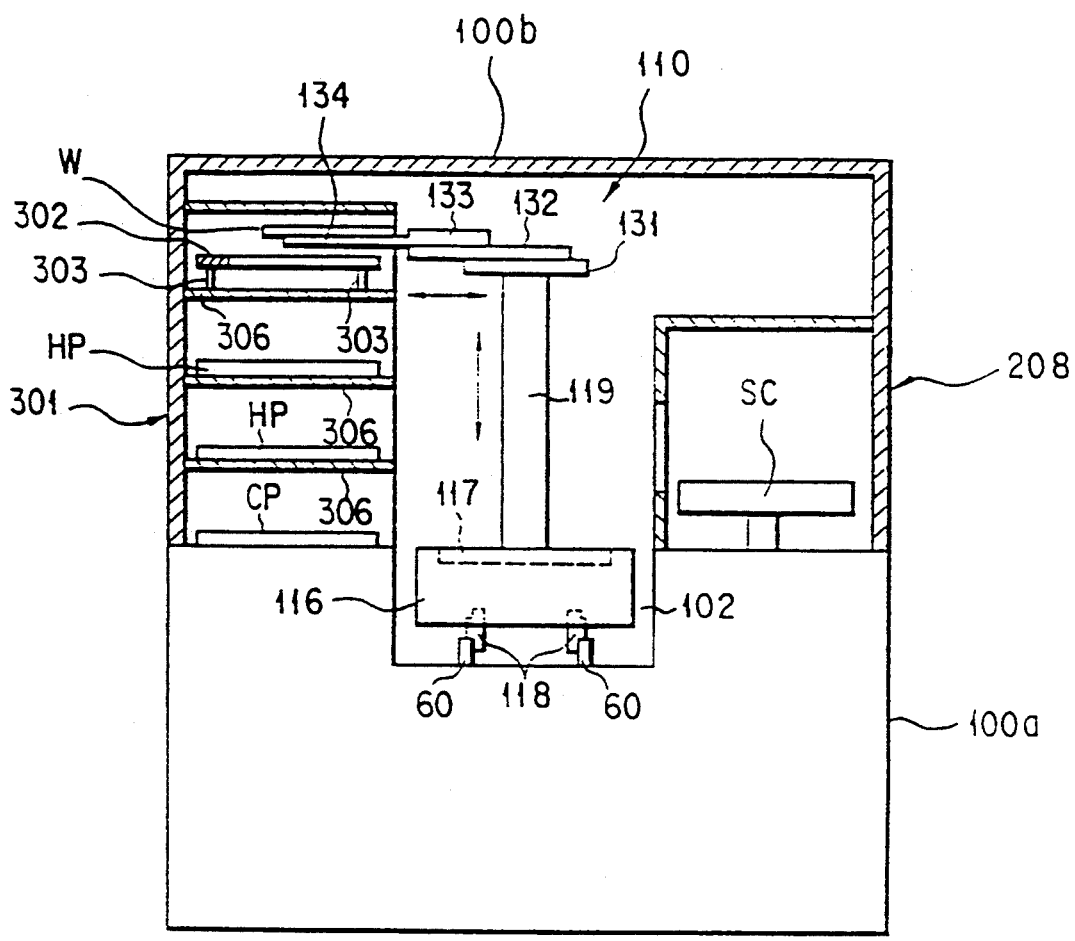
F I G. 6

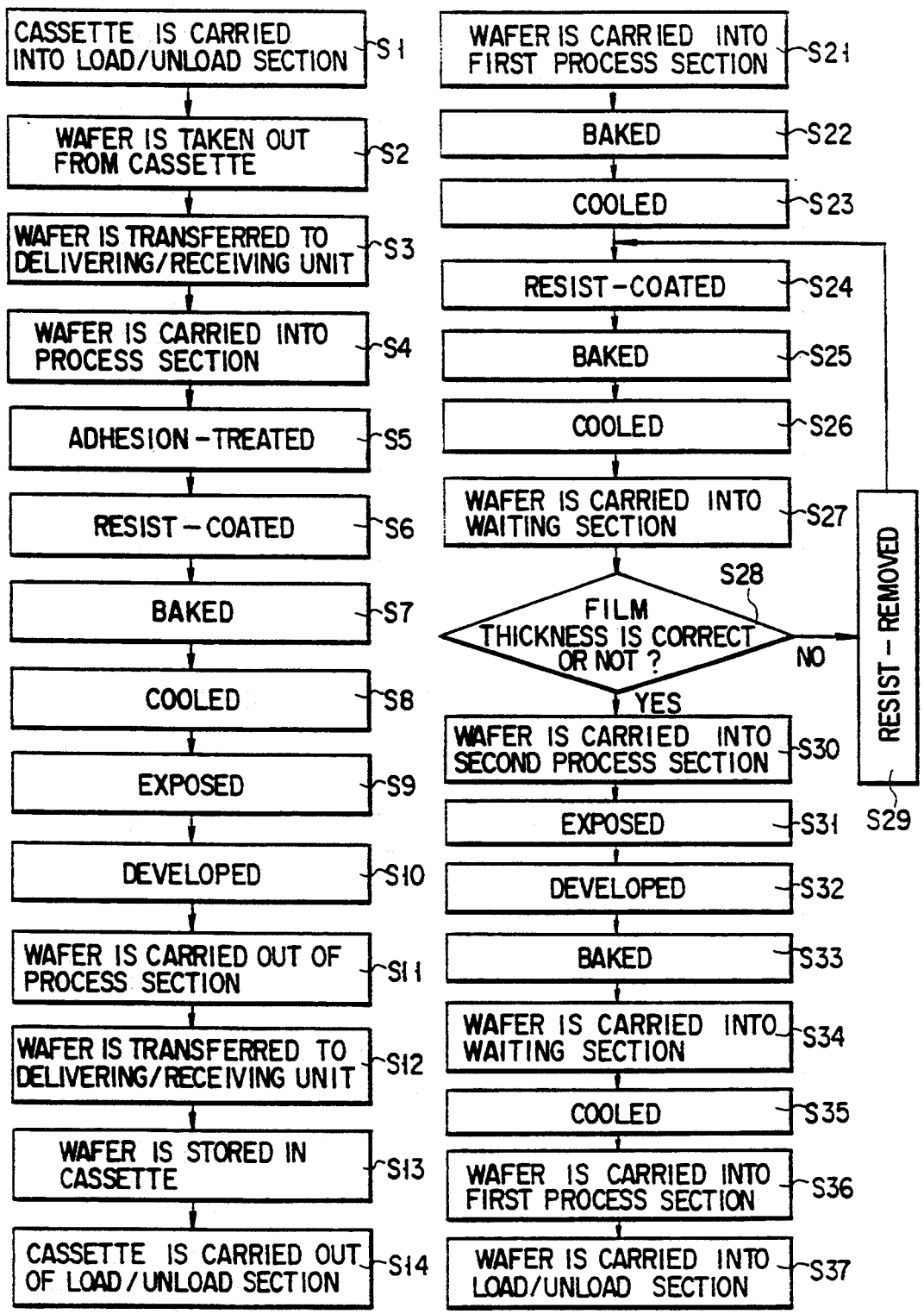

RESIST PROCESSING METHOD

This is a continuation-in-part, of U.S. Ser. No. 904,505, filed on Jun. 25, 1992, now allowed as U.S. Pat. No. 5,202,716, which is a continuation-in-part application of U.S. Ser. No. 627,357 filed on Dec. 14, 1990, now allowed as U.S. Pat. No. 5,177,514, which is in turn a continuation of U.S. Ser. No. 308,470 filed on Feb. 10, 1989, now allowed as U.S. Pat. No. 4,985,722.

BACKGROUND OF THE INVENTION

1. Field of the Invention

The present invention relates to a resist processing method for coating a resist on a surface of a substrate and/or, for developing the photo-resist film subsequent to being exposed with a predetermined pattern, which is used in the manufacture of a semiconductor device, such as an integrated circuit. In particular, the method of the invention is effectively used in manufacturing various types of ASICs with small production in each type.

2. Description of the Related Art

In the manufacture of a semiconductor device, such as an integrated circuit (IC), numerous steps for microfabrication are performed to form a device, such as a transistor, in a wafer of, for example, a silicon single crystal. Of these steps, a photoengraving process (PEP) is of greater importance because of PEP provides the base of a present microfabrication technique. In the PEP, a predetermined resist pattern is formed on the surface of the wafer, the resist pattern being employed as, for example, an etching mask.

The formation of the resist pattern by the PEP comprises the steps of coating a photo-resist on the wafer surface to provide a photo-resist film of uniform thickness, selectively exposing the photo-resist film at a predetermined area and developing the exposed photoresist film to form a desired pattern. In this exposing step, use is made of an exposing device, such as a step and repeat aligner (that is, a stepper). On the other hand, the step for forming the photo-resist film on the substrate surface is carried out with, for example, an apparatus as will be explained below in more detail.

FIG. 1 is a flowchart showing the processing steps of a photo-resist film formation apparatus called a track system, including treating units carrying out a preheating step 4, cooling step 5, coating step 6 and heating step 8. Semiconductor wafers W are introduced into the aforementioned apparatus such that each is held within a cassette 2. The semiconductor wafers W are taken out of the cassette 2 sheet by sheet and conveyed by a belt conveying mechanism 3 sequentially to the respective units for performing the respective treatment to be carried out there. At the preheating step 4, the wafer W has its moisture removed by heating and, subsequent to being cooled by the cooling step 5, is conveyed to the coating unit where a photo-resist is evenly coated on the surface of the wafer w by means of, for example, a spinner coater. The photo-resist-coated wafer W is sent to the heating unit 8 having a conveyor mechanism 7 called a walking beam system. At the heating unit 8, the photo-resist solution on the wafer is converted into a stable film. At the completion of the heating step 8, the wafer w with a desired photo-resist thin film formed thereon is conveyed into cassette 10 where it is stored as a "treated" wafer.

As set out above, in the conventional apparatus, the respective independent treating units are installed in a serial array and a semiconductor wafer to be treated has to be conveyed inevitably past all these units in a "one-way" course in a predetermined order whether all these treatments are required or not. It is, therefore, not possible to freely change a "once-set" treating order or to cause the wafer to pass selectively through only a predetermined unit or units.

The treating process necessary for forming an IC in the semiconductor wafer W, including its treating sequence, differs depending upon the kinds of IC's to be formed on the wafer. In spite of some step or steps being unnecessary, it is unavoidable in the conventional apparatus that all the aforementioned steps have to be carried out on the semiconductor wafer. This causes a bar to the implementation of improved throughput.

Under this situation, there has been a growing demand for an apparatus which can freely select any particular treating unit or units and can freely change the order for passing through the units in accordance with the kinds of wafers to be treated.

Many process stations (or sections) are needed in the course of manufacturing semiconductor devices. It is therefore necessary to consider that the space in factory can be used as efficiently as possible by designing each of the process stations and each interface station between the process stations as small as possible. In addition, it is important that the carriage of wafers can be attained as efficiently as possible in order to increase the throughput of the factory.

SUMMARY OF THE INVENTION

The object of the present invention is to provide a resist-processing method capable of increasing the throughput of the resist process.

According to an aspect of the present invention, there can be provided a resist-processing method comprising, the steps of; preparing a load/unload section, wafer delivering/receiving means, a process section having plural process units, first carrying means and second carrying means; taking out a substrate from a cassette at the load/unload section and carrying it to the delivering/receiving means by a first carrying means; carrying the substrate from the delivering/receiving means to a process section by a second carrying means; resist-processing the substrate in said each process unit of the process section; carrying it from the process section to the delivering/receiving means by the second carrying means; and housing it into the cassette at the load/unload section by the first carrying means.

When a waiting section is arranged between adjacent process sections, the throughput of the resist process can be increased to a greater extent. This is because wafers can be temporarily held in the waiting section and because they can be continuously carried from the load/unload section to the process section even if resist-coating, exposing, developing and other units are being used in the process sections.

When heating and cooling plates are provided in the waiting section, the temperature of each wafer can be controlled in the waiting section.

It is preferable that the second carrying means or robot at the process section has two handling arms. When arranged like this, it can pick up a wafer from one process unit by its one handling arm while carrying another wafer into the other process unit by its other handling arm. This can also increase the throughput of the resist process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a vertically-sectioned view showing a waiting section in the second resist process system;

FIG. 10 is a flowchart showing the resist-processing method according to a first embodiment of the present invention;

FIG. 11 is a flowchart showing the resist-processing method according to a second embodiment of the present invention;

DETAILED DESCRIPTION OF THE PREFERRED EMBODIMENTS

Figure 1:
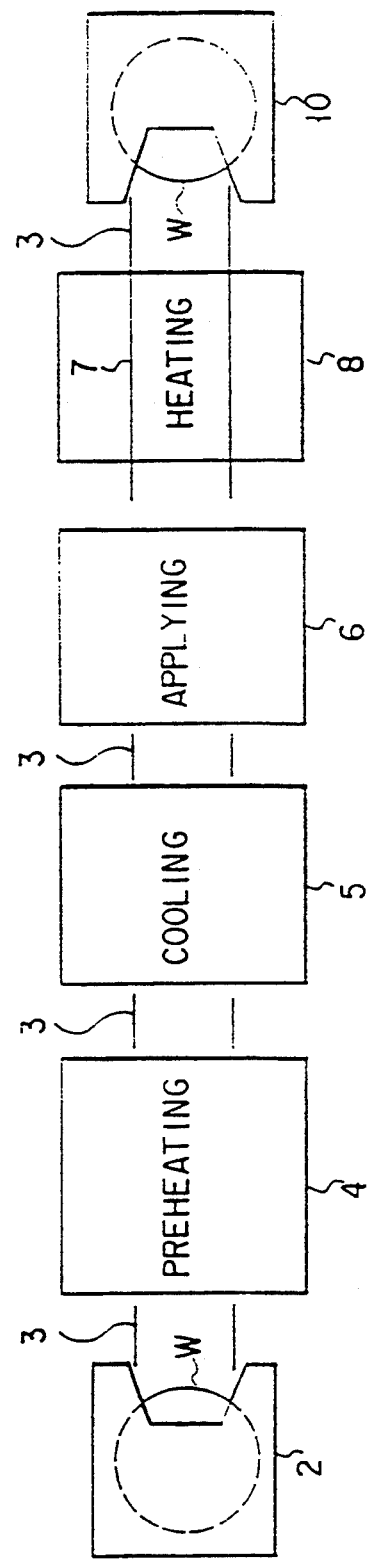
FIG. 1 is a block diagram showing the conventional resist processing system.
Figure 2:
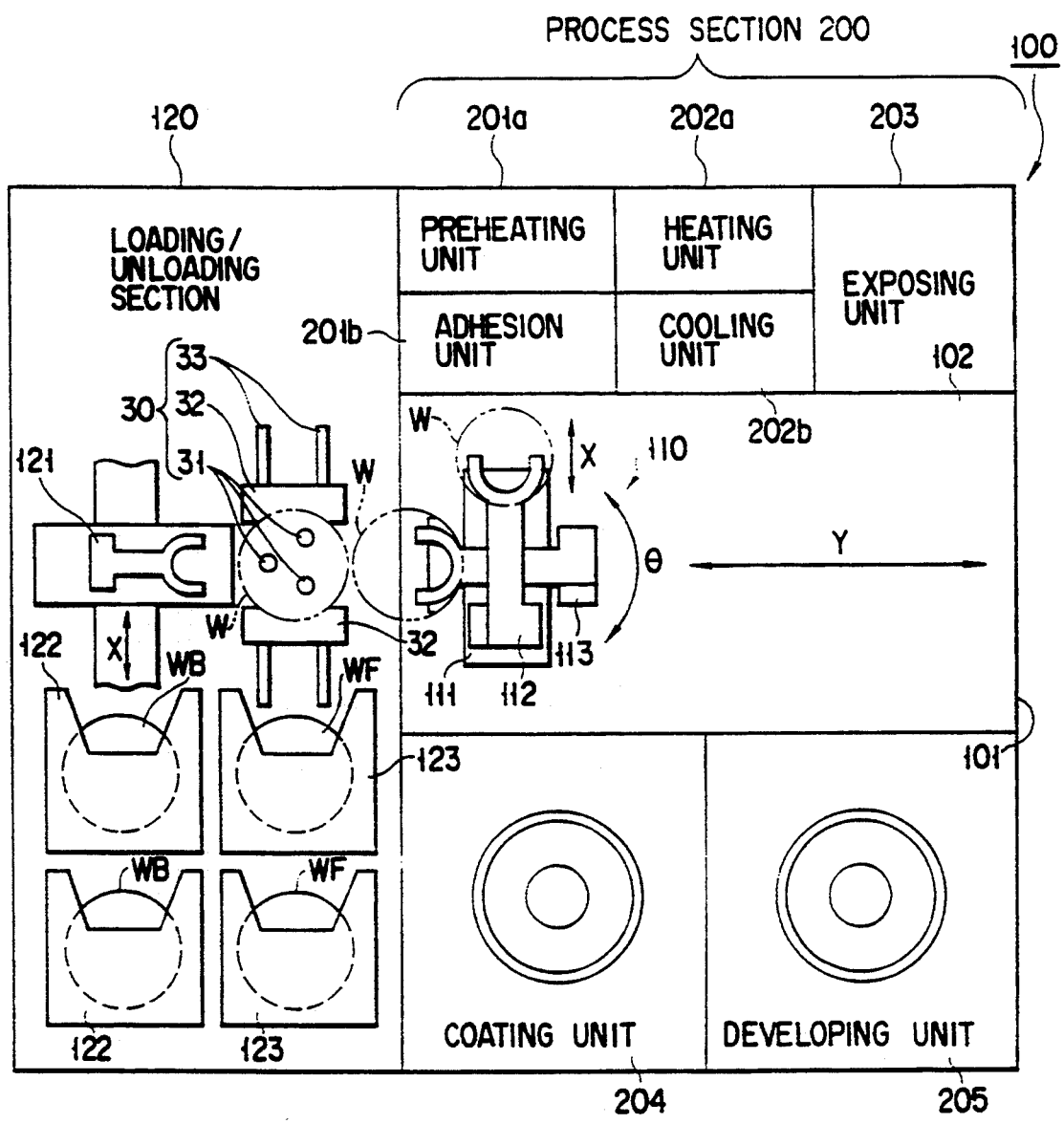
FIG. 2 is a plan showing a part of wafer loading/unloading and process sections.

FIG. 2 shows a plan view showing an apparatus 100 which is adapted to apply a photo-resist film on a semiconductor wafer surface and/or to develop the photoresist film subsequent to being exposed with a specific pattern. In FIG. 2, reference numeral 101 shows a body base of the apparatus. A passage 102 is provided at the middle of the body base 101 and extends in a lateral direction as indicated by an arrow Y in FIG. 2. On one side of the passage 102 are provided a prehearing unit 201a for eliminating moisture, etc. from untreated 15 semiconductor wafer by heating the wafer with or without HMDS treatment, an adhesion unit 201b for applying HMDS the wafer, a heating unit 202 for heating the wafer subsequent to, for example, being coated with the photoresist solution to dry it, and an exposing unit 203 for exposing the wafer. The heating unit 202 has upper heating plate and lower heating plate arranged in an overlapping fashion. On the other side of the passage 102, a coating unit 204 and a developing unit 205 are provided. The applying unit 204 is provided in order to coat, a photo-resist solution on the surface of the wafer which has been preheated and cooled, or in order to spray a developing solution to an exposed photoresist film on the wafer. Though the preheating unit 201a and the adhesion unit 201b are shown provided in a plan array in FIG. 2 for convenience's sake, as a matter of fact, the preheating unit 201a is provided over the adhesion unit 201b.

A second wafer conveying device (robot) 110 is mounted on the passage 102 to allow the wafer to be travelled in the Y direction by a drive mechanism, not shown, such as a ball screw. A tweezer (handling arms 131, 132, 133) of the second robot 110 can be moved to the X direction (the width direction of the passage 102), simultaneously in the Y direction (longitudinal direction or the passage 102) and the Z direction (vertical direction), and further can be rotated independently or simultaneously in the $\theta$ direction as shown in FIG. 2. In order to allow the tweezer to be moved as described above, a stepping motor and drive mechanism, not shown, such as a ball screw, are coupled to the carriage 116. The second robot 110 is employed to convey the wafer W to a respective one of the aforementioned treatment units.

A wafer loading/unloading mechanism 120 is provided to the left side of body base 101 and houses a plurality of wafer cassettes 122, 123 with those untreated semiconductor wafers $W_B$ held in the respective wafer cassettes 122 and those treated wafers $W_F$ held in the respective wafer cassettes 123. A first wafer conveying device (robot) 121 is provided in the wafer loading/unloading mechanism 120 to hold the wafer W under an attraction force imposed to the lower surface of the wafer. The first robot 121 can be moved in the X and Y directions and can pick up the untreated wafer $W_B$ from the cassette 122 and store the treated wafer $W_F$ into the wafer cassette 123.

The first robot 121 of the wafer loading/unloading mechanism 120 delivers the untreated wafer $W_B$ to the tweezer of the second robot 110 and receives the treated wafer $W_F$ from those tweezer of the second robot 110. That deliver/receive interface is provided at a boundary between the passage 102 and the wafer loading/unloading mechanism 120.

The delivering/receiving operation of the wafers is achieved relative to the respective treatment units by the tweezer of the second robot 110. The wafer W undergoes various treatments at the respective units 201a to 205 in accordance with a predetermined order. The operation of conveying wafers is all controlled by a control system, not shown. The various treatments at the process units 201a to 205 can freely be set by modifying the program of a control system. That is, the treatments can be effected at some process units alone in accordance with a modified treatment sequence.

A wafer transfer device 30 is arranged in the loading/unloading section 120. The wafer W is transferred from the section 120 to the process section 200 through the wafer transfer device 30.

The wafer transfer device 30 includes guide rails 33, a pair of sliders 32, and three support pins 31. The opposite surfaces of the sliders 32 are curved along the periphery of the wafer W, and formed into a conical shape whose diameter is gradually decreaesd toward the bottom. The pair of sliders 32 are caused to slide on the guide rails 33, by a driving motor (not shown), in the opposite directions. That is, distance therebetween is increased or decreased.

The three support pins 31 vertically extend downward at intermediate positions between the sliders 32, and are designed to be vertically moved by a pin lifting unit (not shown). The pins 31 and the sliders 32 perform centering (positioning) of the wafer W with respect to the second robot 110.

Figure 3:
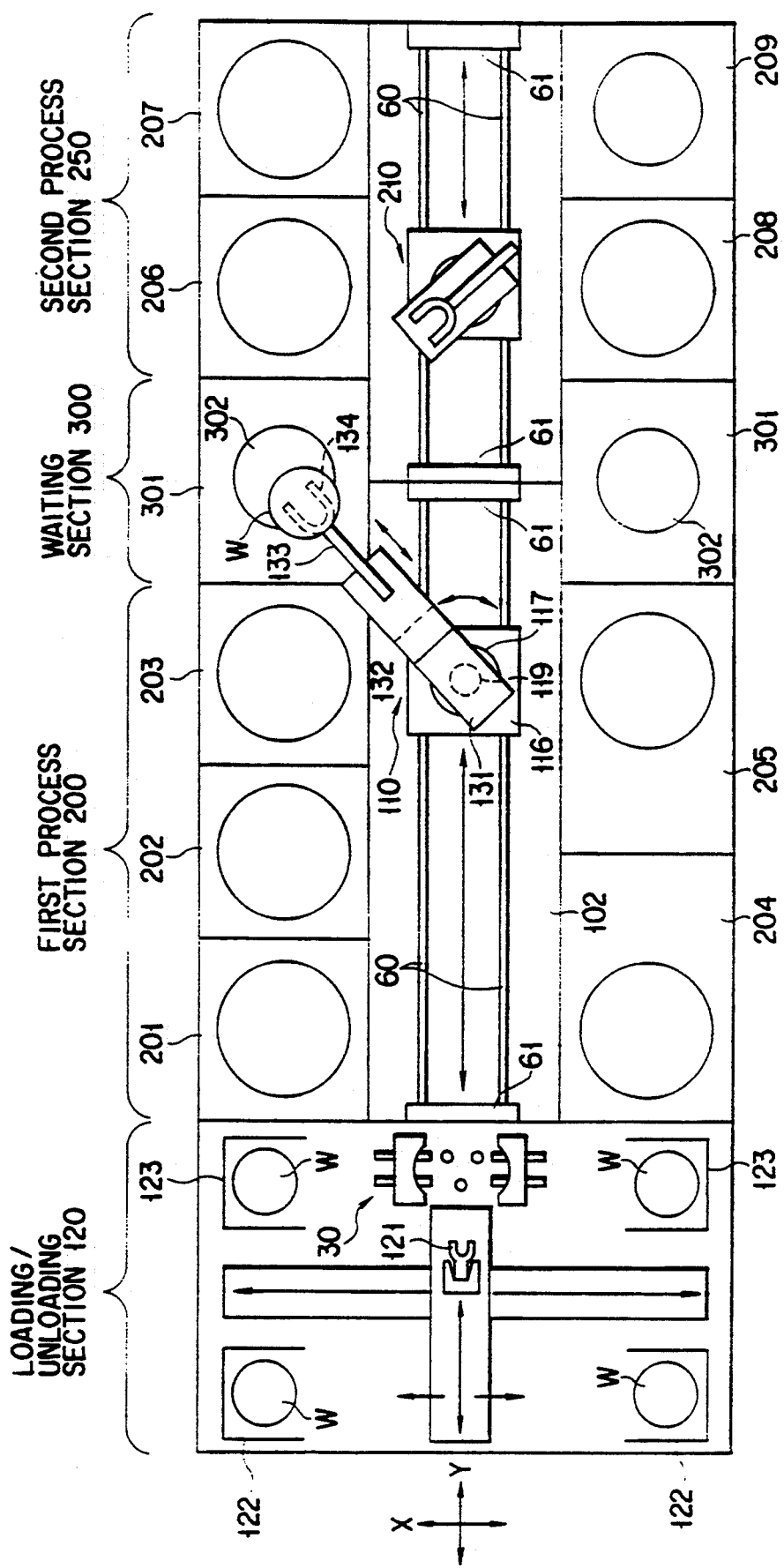
FIG. 3 is a plan schematically showing the whole of the resist process system.

As shown in FIG. 3, a carriage passage 102 extends along the longitudinal center line of first and second process sections 200 and 250. Process units 206, 207 and 208 of the second process section 250 are arranged along the passage 102 on both sides thereof. A pair of rails 60 extends along the passage 102 at the sections 200 and 250. The second robot 110 runs on the rails 60 in the first section 200 and a third robot 210 runs also on the rails 60 in the second section 250. Stoppers 61 are arranged at both ends of the rails 60 which extend at the first process section 200 and also at both ends of the rails 60 which extend at the second process section 250. Each of these stoppers 61 includes a collision preventing sensor (not shown).

A waiting section 300 including two units 301 is arranged between the first 200 and the second process section 250. The waiting units 301 are opposed to each other with the passage 102 interposed between them. They are positioned in a range where the second and third robots 110 and 210 which run on the rails 60 can gain access to them. They can be detached from their adjacent process units 203, 206 and 205, 208. They serve to transfer wafers between the first 200 and the second process section 250 and they also serve to temporarily keep the wafers.

The rails 60 for the second robot 110 and those for the third robot 210 are separated in front of the waiting unit 301. When arms 131, 132 and 133 of each of the robots 110 and 210 are extended oblique in relation to the rails 60, their front fork 134 can reach a stage 302 of each of the waiting units 301.

Figure 9:
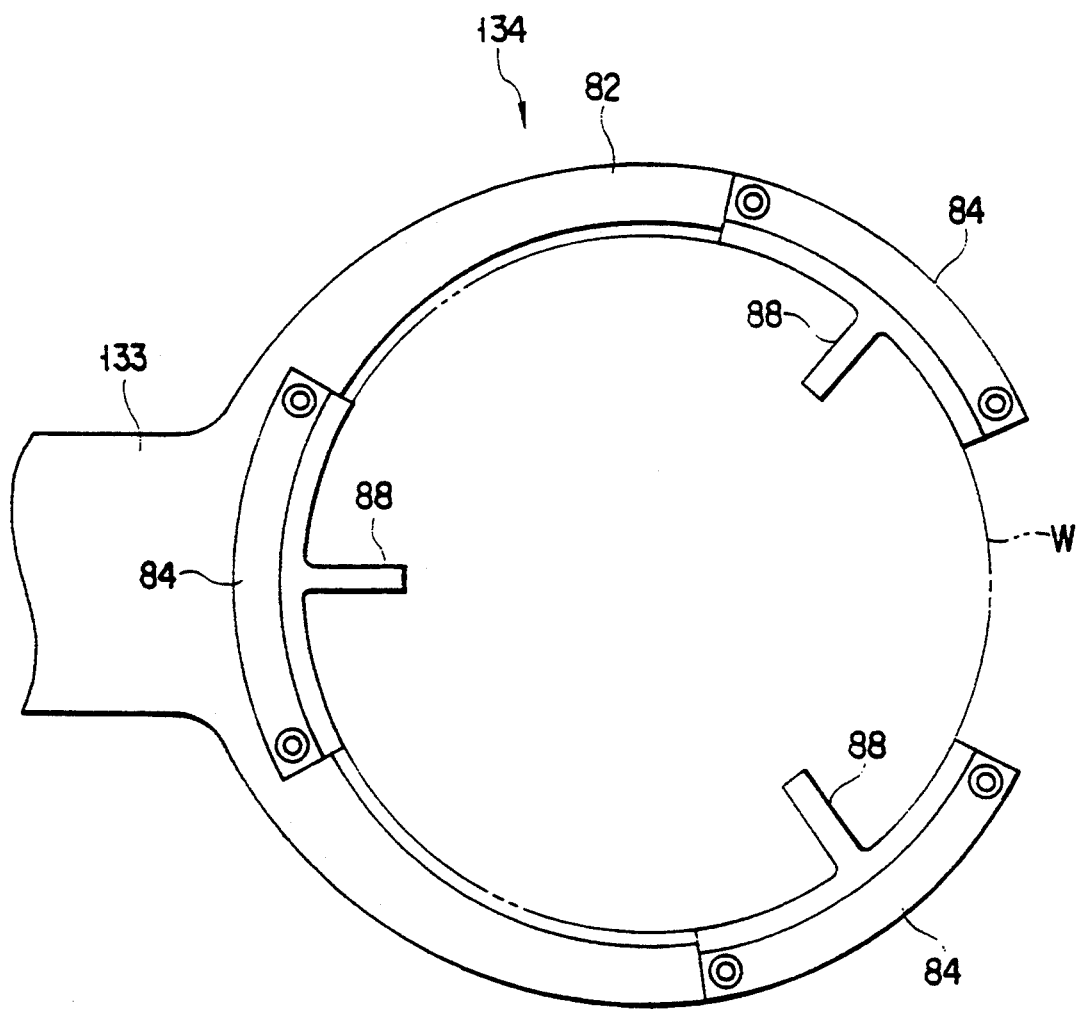
FIG. 9 is a plan showing a wafer holder of the carrying robot.

As shown in FIG. 9, three support members 84 are fixed to the support frame 82 at substantially equal intervals such that support portions 88 formed at the distal ends extend inward from the frame 82.

Figure 4:
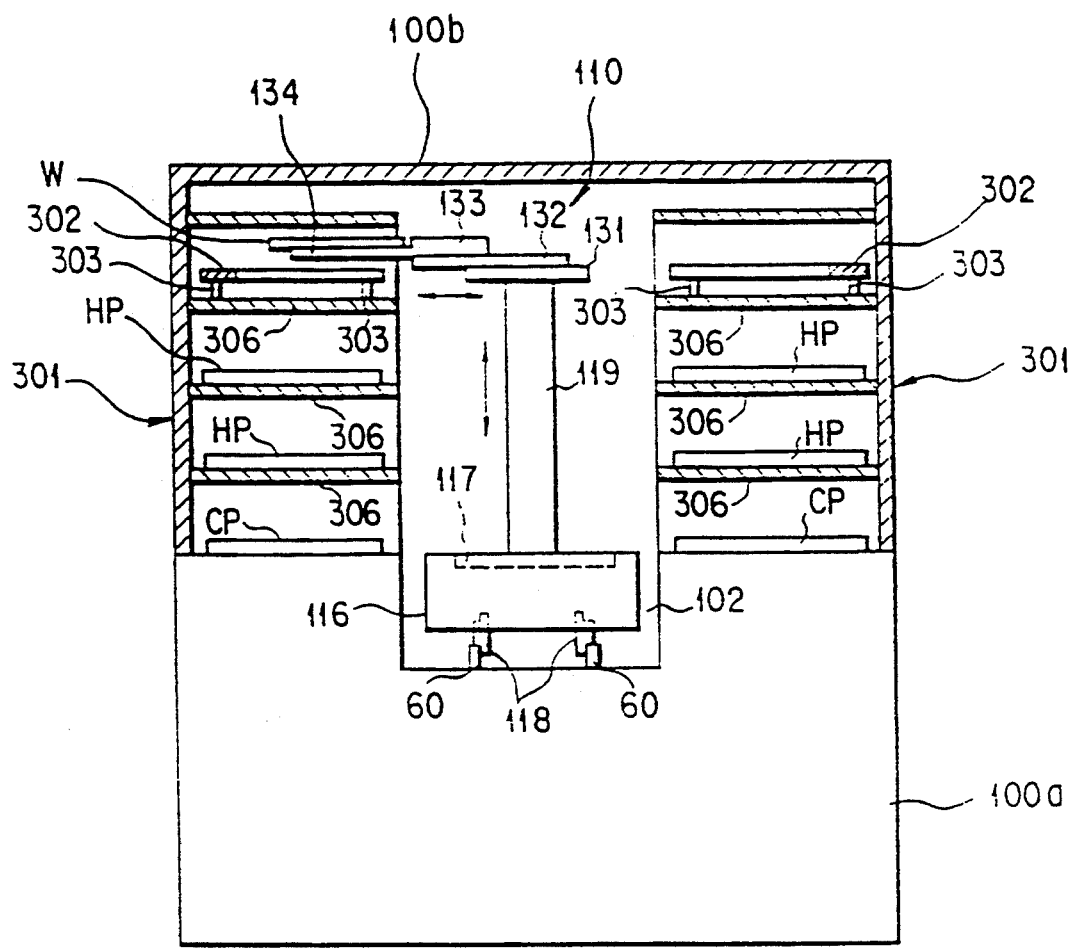
FIG. 4 is a vertically-sectioned view showing a waiting section in the resist process system.

As shown in FIG. 4, each waiting section 301 includes four deck compartments vertically divided by partitions 306. The wafer stage 302 is arranged in the most upper deck compartment. The wafer stage 302 is shaped like a ring but cut away at its portion so as to allow the wafer to be mounted on and removed from it. It is fixed to the partition 306 by support rods 303. A cooling plate CP is arranged in the most lower compartment and heating plates HP are arranged in the second and third compartments, respectively. The wafer stage 302 may be arranged in the most lower or in any of the second and third compartments.

Each of the units 201–209 and 301 is positioned on an air-conditioned body 100a and enclosed by a cover 100b.

Referring to FIG. 4, it will be described how wafers are transferred or carried by the second robot 110.

A body 116 of the second robot 110 has two pairs of wheels 118 which run on the rails 60. A turntable 117 is arranged, rotatable on a horizontal plane, on the top portion of the body 116. A lifting shaft 119 is erected, extending upward, on the turntable 117. A base plate 131 is attached to the top of the lifting shaft 119 and the extensible arms 132 and 133 are arranged on the base plate 131. The extensible arms 132 and 133 are placed one upon the other and they can be slid relative to each other on the base plate 131. The wafer holder or fork 134 is attached to the front end of the upper arm 133. Photosensors (not shown) are attached to the wafer holder 134. This wafer holder 134 is described in detail in U.S. Pat. Nos. 4,958,722 and 5,061,144.

Shaft rods of the wheels 118, turntable 117, lifting shaft 119 and extensible arms 132, 133 are connected to drive shafts of stepping motors (not shown), which are controlled by controllers backed up by a computer system.

It will be described how silicon wafers each having a diameter of 8 inches are successively processed by the above-described resist process system.

A silicon wafer W, 8 inches in diameter, is carried from the loading/unloading section 120 to the first process section 200 by the first robot 110. The wafer W is adhesion-processed at the adhesion unit 201, resist-coated at the coating unit 204 and baked at the heating unit 202. After this baking process, it is carried into the cooling compartment of the waiting unit 301 and cooled there.

While the wafer w is being processed in this manner, another wafer w is exposed in the exposing unit 203 and a further wafer W is developed in the developing unit 205. These units at the first process section 200 are occupied by the wafers as described above, the second robot 110 runs directly to the waiting section 300 to place wafers W on the stages 302 in the unit 301. The third robot 210 takes out the wafers W from the waiting units 301 and carried them into the second process section 250 where a series of adhesion, resist-coating, exposing and developing processes are applied to them.

Although two process sections 200 and 250 have been connected to each other in the case of the above-described embodiment, the present invention is not limited to it, but third and fourth process sections may be added with the waiting section 300 interposed between them.

Figure 5:
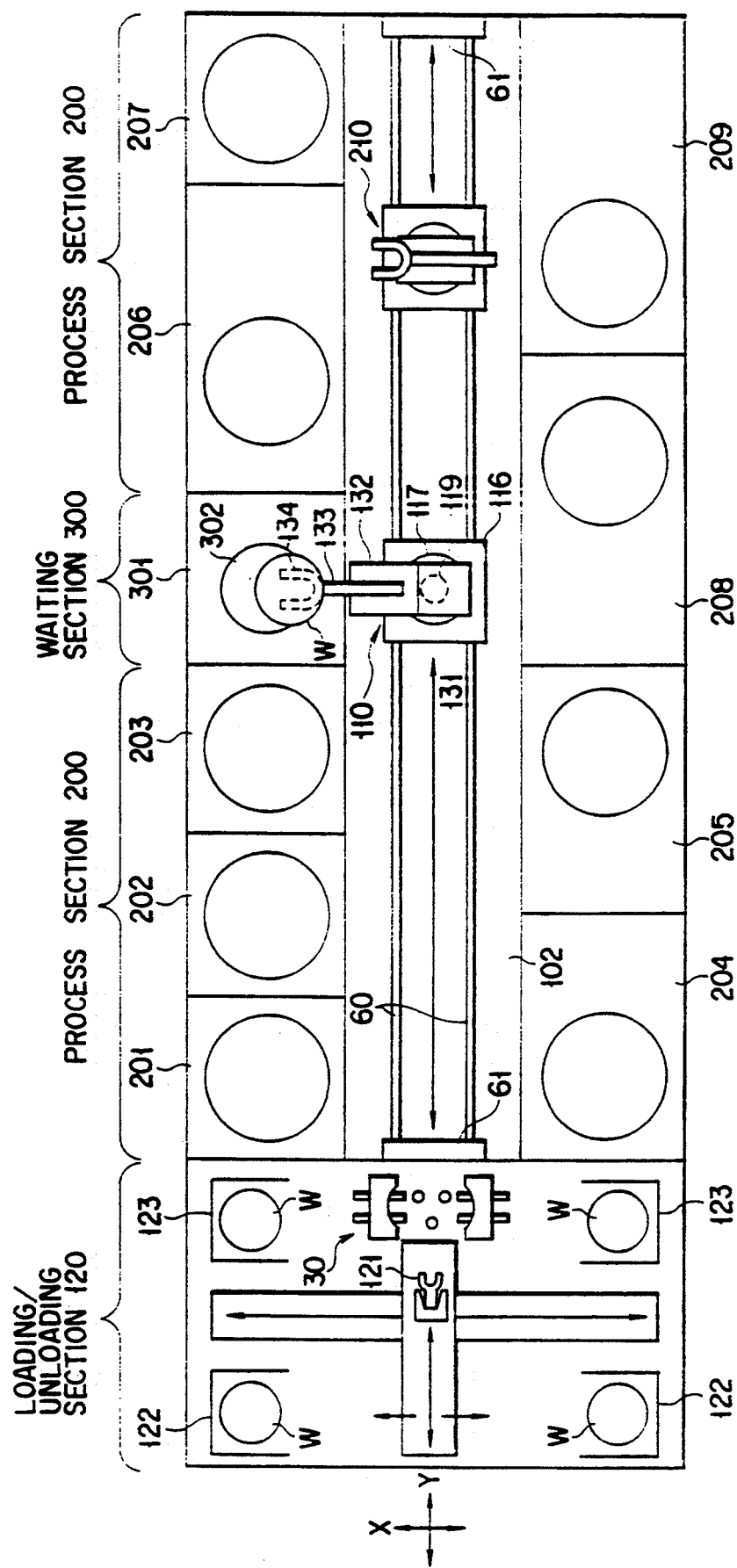
FIG. 5 is a plan schematically showing the whole of the resist process system.

As shown in FIG. 5, the waiting section 300 is arranged not on both sides of the rails 60 but on one side thereof, that is, between the exposing 203 and the developing unit 206. The rails 60 extend from one end to the other end of the process sections line and the second and third robots 110 and 210 run on the rails 60 in front of the waiting unit 301.

As shown in FIG. 6, the waiting unit 301 is opposed to the coating unit 208 in which a spin coater is housed.

Figure 7:
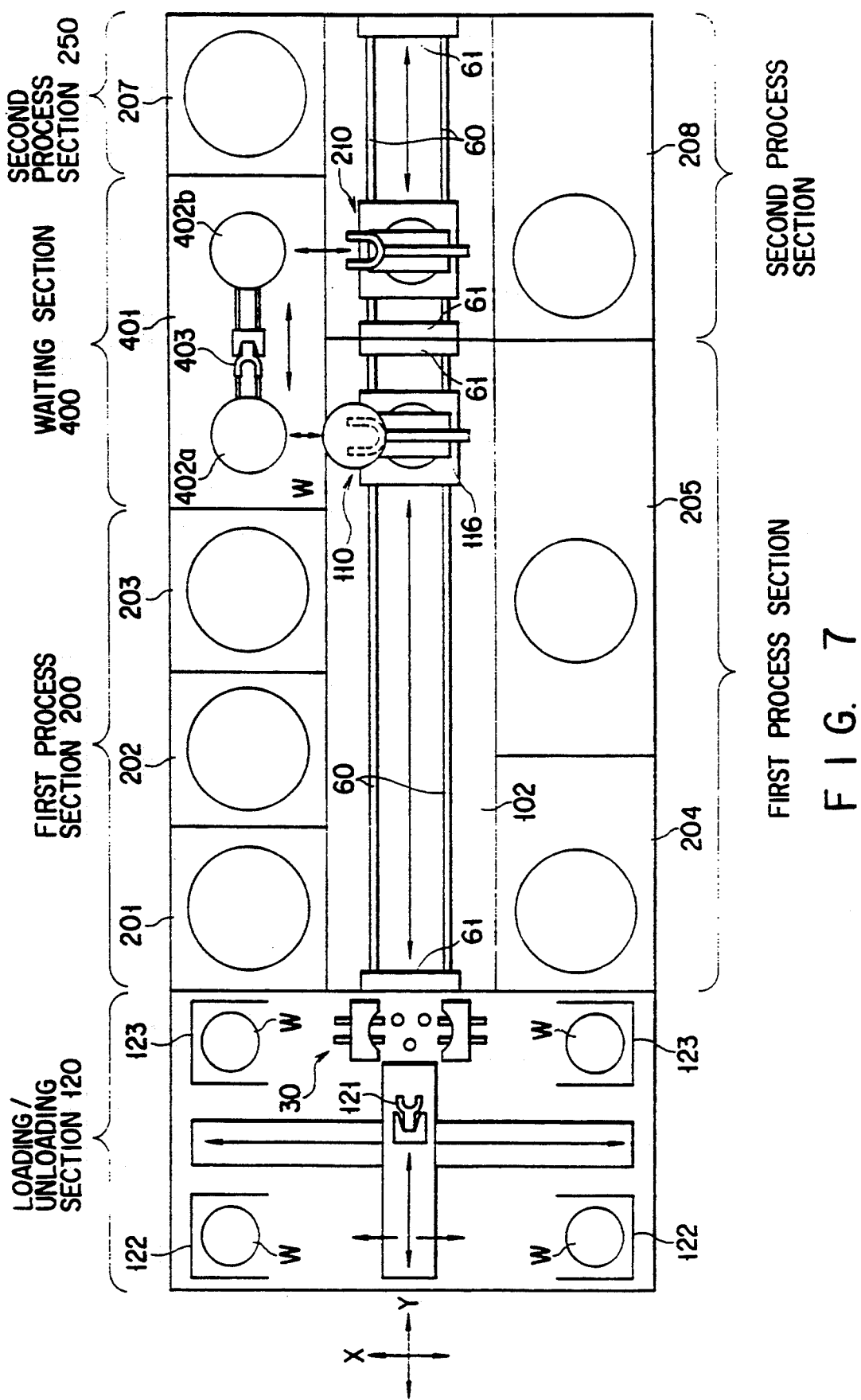
FIG. 7 is a plan schematically showing the whole of the resist process system.

As shown in FIG. 7, a waiting section 400 is arranged between the first 200 and the second process section 250. A waiting unit 401 is beside the rails 60 and positioned in front of the second and third robots 110 and 210 when these robots finish their running on the rails 60 toward it.

Two wafer stages 402a and 402b are provided in the waiting unit 401. One wafer stage 402a is provided in front of the running area of the second robot 110 and the other wafer state 402b is provided in front of the running area of the third robot 210. A handling device 403 is arranged between the wafer stages 402a and 402b. This handling device 403 is substantially the same as the one 121 at the loading/unloading section 120.

Each of the wafer stages 402a and 402b is substantially same the same as the one 302 in the first embodiment. However, the wafer stages 402a and 402b are not fixed to the frame but supported rotatably on a plane by the frame.

It will be described how the wafers W are loaded and unloaded from the waiting unit 401.

A wafer W is taken out from the process unit 205 and carried to the waiting section 400 by the second robot 110. The second robot 110 is positioned in front of the first wafer stage 402a of the waiting unit 401 to mount the wafer W on the stage 402a. The first stage 402a is turned by a quarter to direct its cut-away portion toward the handling device 403. The wafer W is transferred from the first stage 402a to the second stage 402b by the handling device 403. The third robot 210 is then positioned in front of the waiting section 400 to carry the wafer W into the second process section 250.

Figure 8:
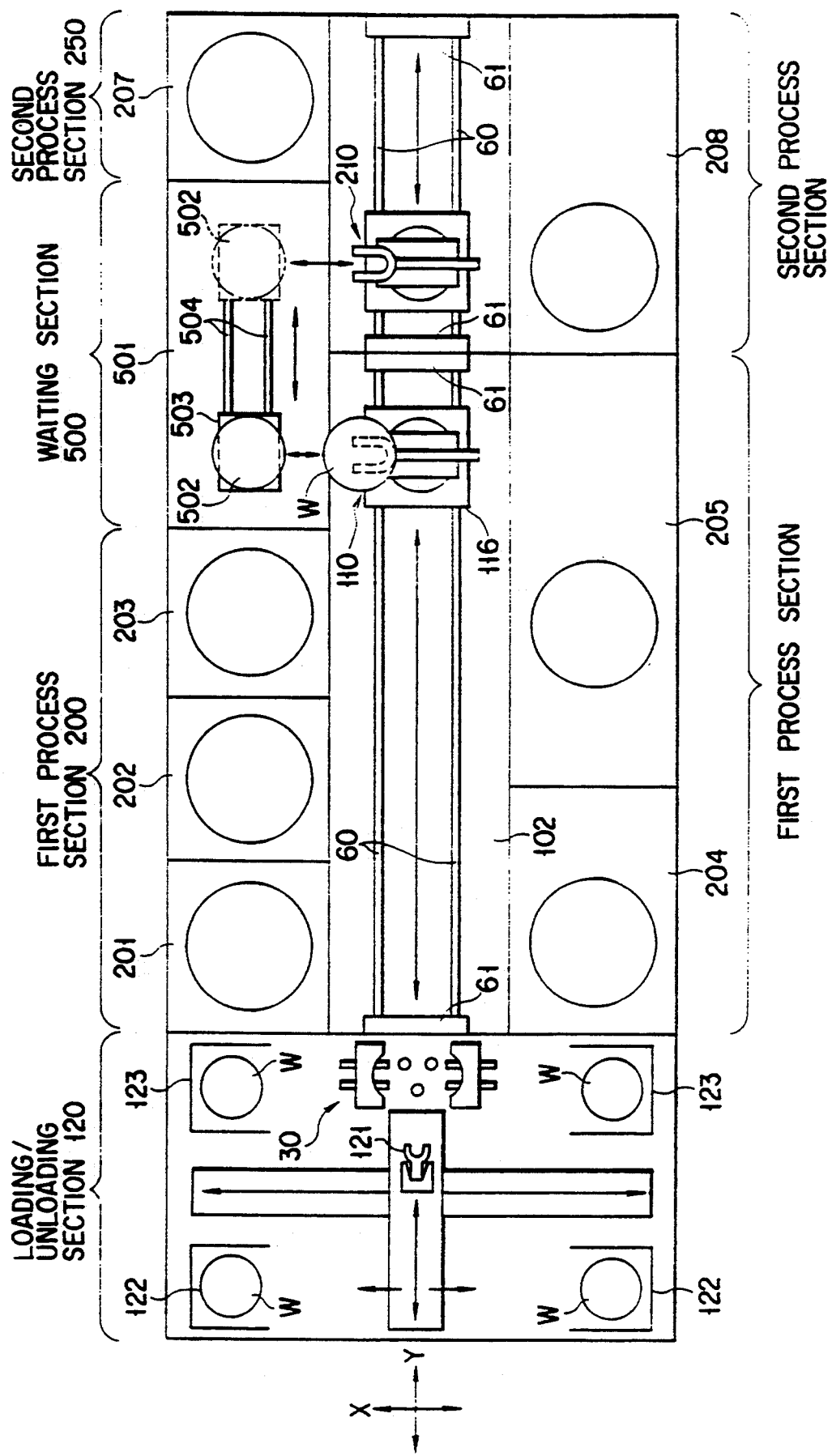
FIG. 8 is a plan schematically showing the whole of the resist process system.

As shown in FIG. 8, a waiting section 500 is arranged between the first 200 and the second process section 250. A waiting unit 501 is beside the rails 60 and it is positioned in front of the second and third robots 110 and 210 when they finish their running on the rails 60 toward it.

Only one wafer stage 502 is provided in the waiting unit 501 and it is mounted on a travel device 503. Guide rails 504 are arranged at the waiting unit 501, extending parallel to the rails 60 in the passage 102. The single wafer stage 502 on the travel device 503 can be thus moved on the rails 504.

The single wafer stage 502 is substantially the same as the one 302 in the first embodiment. The travel device 503 is also substantially the same as the body 116.

It will be described how wafers W are carried into and out of the waiting unit 501.

A wafer W is taken out from the process unit 20 and carried into the waiting section 500 by the second robot 110. The second robot 110 is positioned in front of the wafer stage 502 in the waiting unit 501 to transfer the wafer a onto the stage 502. The wafer W is moved from the section 200 to the section 250. The third robot 210 is then positioned in front of the waiting section 500 to carry the wafer W from the waiting section 500 into the second process section 250.

The resist-processing method according to a first embodiment of the present invention will be described with reference to FIGS. 2 and 10.

A cassette 122 is carried to the station at the load/unload section 120 by the carrying robot (not shown) (Step S1). Twenty five sheets of 8-inch silicon wafers W are housed in the cassette 122. A sheet of wafer W is picked up by the first robot 121 and carried to the delivering/receiving unit 30 (Step S2). The wafer W is mounted on pins 31 of the delivering/receiving unit 30 and centered by the slider 32 (Step S3).

The wafer W is carried into the process section 200 by the second robot 110 (Step S4). It is then adhesion-processed with HMDS by the adhesion unit 201b (Step S5). It is resist-coated by the coating unit 204 (Step S6). Further, it is baked by the unit 202a (Step S7), cooled by the unit 202b (Step S8), exposed by the unit 203 (Step S9), and developed by the unit 205 (Step S10). When all of these steps are finished, it is carried out of the process section 200 (Step S11).

The wafer W is transferred to the delivering/receiving unit 30 by the second robot 110 (Step S12) and picked up, carried and housed in the cassette 123 by the first robot 121 (Step S13). when the cassette 123 is filled with processed wafers W, it is carried out of the load-/unload section 120 (Step S14).

As shown in FIG. 5, it may be arranged that a waiting section 300 is included in the process section 200 to temporarily hold wafers W, which are to be processed, in the unit 301. This can increase the throughput of the resist process.

The resist-processing method according to a second embodiment of the present invention will be described with reference to FIGS. 3 and 11. The same parts as those of the first embodiment will not described in this case.

A wafer W is carried from the delivering/receiving unit into the first process section 200 by the second robot 110 (Step S21). It is baked by the preheating unit 201a (Step S22) and cooled by the cooling unit 202b (Step S23).

It is resist-coated by the coating unit 204 (Step S24). Further, it is baked by the unit 202a (Step S25) and cooled by the cooling unit 202b (Step S26).

It is carried to the waiting section 300 and mounted on the stage 302 in the uppermost compartment (Step S27). The thickness of its resist film is measured by the optical sensor of the non-contact type (not shown) to confirm whether its film thickness is correct or not (Step S28). when the answer is "No", the coated resist is removed from it (Step S29) and it is then returned to the Step S24 and again resist-coated.

When the answer is "YES", it is carried into the second process section 250 by the third robot 210 (Step S30). It is exposed by the unit 207 (Step S31), developed by the unit 206 (Step S32) and baked by the unit 209 (Step S33).

It is carried to the waiting section (Step S34). It is mounted on the cooling plate CP in the lowermost compartment and cooled (Step S35). When all of these steps are finished, the wafer which has been processed is carried to the first process section 200 (Step S36) and then to the load/unload section (Step S37).

Figure 12:
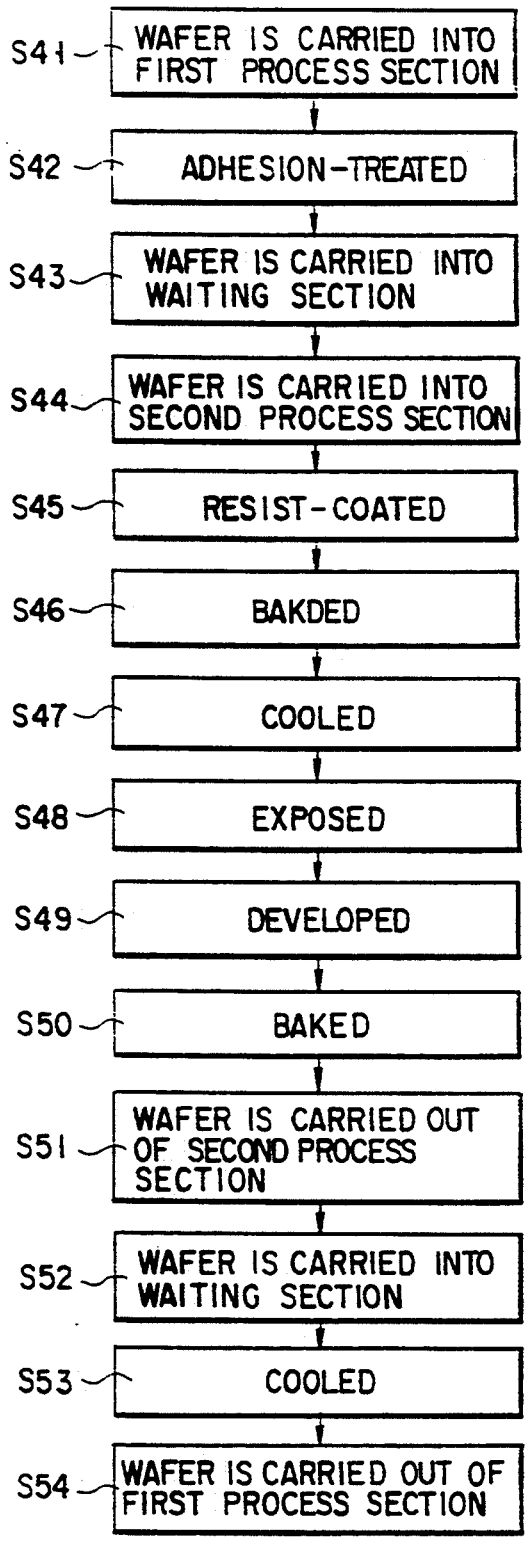
FIG. 12 is a flowchart showing the resist-processing method according to a third embodiment of the present invention.

The resist-processing method according to a third embodiment of the present invention will be described with reference to FIGS. 3 and 12.

A wafer W is carried into the first process section 200 by the second robot 110 (Step S41) and adhesion-treated by the unit 201b (Step S42). It is carried into the waiting section 300 (Step S43).

It is carried into the second process section 250 by the third robot 210 (Step S44). It is resist-coated by the unit 208 (Step S45), baked by the unit 209 (Step S46), and cooled in the lowermost compartment at the waiting section 300 (Step S47). Further, it is exposed by the unit 207 (Step S48), developed by the unit 206 (Step S49) and baked by the unit 209 (Step S50). It is then carried out of the second process section 250 (Step S51).

It is carried into the waiting section 300 (Step S52) and cooled by the cooling plate CP in the lowermost compartment (Step S53). It is carried from the first process section 200 to the load/unload section by the second robot (Step S54).

Figure 13:
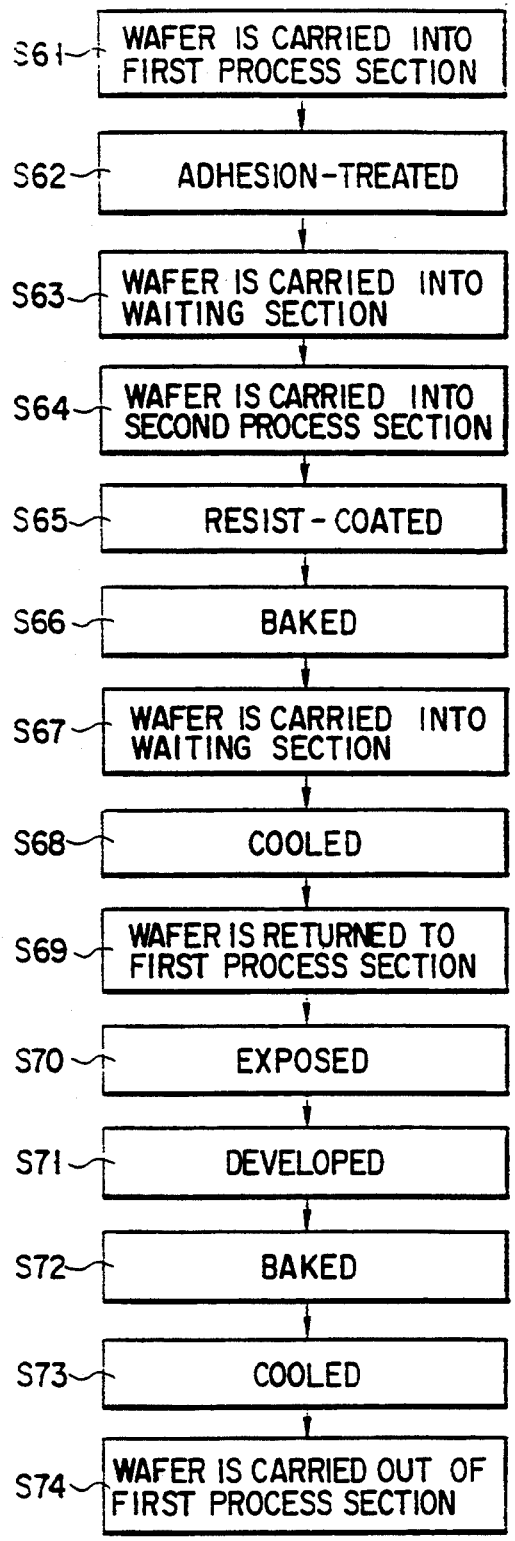
FIG. 13 is a flowchart showing the resist-processing method according to a fourth embodiment of the present invention.

The resist-processing method according to a fourth embodiment of the present invention will be described referring to FIGS. 3 and 13.

A wafer W is carried into the first process section 200 by the second robot 110 (Step S61) and adhesion-treated by the unit 201b (Step S62). It is carried to the waiting section 300 (Step S63).

It is carried into the second process section 250 by the third robot 210 (Step S64). It is resist-coated by the unit 208 (Step S65) and baked by the unit 209 (Step S66).

It is carried into the waiting section 300 (Step S67) and cooled in the lowermost compartment (Step S68).

It is returned to the first process section (Step S69). It is exposed by the unit 203 (Step S70), developed by the unit 205 (Step S71), baked by the unit 202a (Step S72), and cooled by the unit 202b (Step S73). This wafer W which has been processed is then carried out from the first process section 200 (Step S74).

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resist processing method comprising, the steps of:
    taking out a substrate from a cassette and transferring the substrate to a delivering/receiving means at a load/unload section by a first carrying means;
    carrying the substrate from the delivering/receiving means to a process section including a plurality of process units by a second carrying means;
    resist-processing the substrate in each of said process units of the process section;
    carrying the substrate from the process section to the delivering/receiving means by the second carrying means; and
    housing the substrate into the cassette at the load/unload section by the first carrying means.

2. The resist processing method according to claim 1, wherein said resist-processing step includes the steps of:
    coating resist on the substrate, thereby obtaining a resist film on the substrate;
    exposing the resist film; and
    developing the exposed resist film.

3. The resist processing method according to claim 2, further comprising an adhesion step of conditioning a surface of the substrate before the resist coating step.

4. The resist processing method according to claim 3, further comprising a baking step which bakes the substrate before the resist coating step.

5. The resist processing method according to claim 3, further comprising a baking step which bakes the substrate after the resist coating step.

6. The resist processing method according to claim 4 or 5, further comprising a step of cooling the substrate after the baking step.

7. The resist processing method according to claim 1, wherein said first carrying means has a holder for holding a sheet of substrate and a handling arm, connected to the holder, for moving the holder back and forth.

8. The resist processing method according to claim 1, wherein said second carrying means includes:
    plural holders, each of said plural holders for holding a sheet of substrate; and
    plural handling arms corresponding to said plural holders, each of said plural handling arms for moving the corresponding holder independently of others of said plural holders and the corresponding handling arms thereof.

9. The resist processing method according to claim 1, wherein said second carrying means includes:
    two holders, each of said holders for holding a sheet of substrate; and
    two handling arms, each corresponding to one of said holders, for moving the corresponding holder independently of the other holder.

10. The resist processing method according to claim 7, wherein the holder of said first carrying means includes plural pins for supporting the substrate thereon while partly contacting an underside of said substrate.

11. The resist processing method according to claim 8, wherein each holder of said second carrying means includes plural pins for support the substrate thereon while partly contacting an underside of said substrate.

12. A resist processing method comprising, the steps of:
    taking out a substrate from a cassette and transferring the substrate to a delivering/receiving means at a load/unload section by a first carrying means;
    carrying the substrate from the delivering/receiving means to a first process section including a plurality of process units by a second carrying means;
    resist-processing the substrate in each of said process units of the first process section or carrying the substrate to a waiting section when each of said process units at the first process section is being used;
    carrying the substrate from the waiting section to a second process section having a plurality of process units by a third carrying means;
    resist-processing the substrate in each of said process units of the second process section;
    carrying the substrate to the waiting section by the third carrying means;
    carrying the substrate from the waiting section to the first process section by the second carrying means;
    carrying the substrate from the first process section to the delivering/receiving means by the second carrying means; and
    housing the substrate into the cassette at the load/unload section by the first carrying means.

13. The resist processing method according to claim 13, further comprising an adhesion step of conditioning a surface of the substrate before the resist coating step.

14. The resist processing method according to claim 13, further comprising an adhesion step of conditioning a surface of the substrate before the resist coating step.

15. The resist processing method according to claim 13, further comprising a baking step which bakes, using heat, each substrate before the resist coating step.

16. The resist processing method according to claim 13, further comprising a baking step which bakes the substrate after the resist coating step.

17. The resist processing method according to claim 15 or 16, further comprising a step of cooling the substrate after the baking step.

18. The resist processing method according to claim 12, wherein said first carrying means includes a holder for holding a sheet of substrate and a handling arm, connected to the holder, for moving the holder back and forth.

19. The resist processing method according to claim 12, wherein each of said second and third carrying means has plural handling arms, each connected to a corresponding holder for holding a sheet substrate, the plural handling arms for moving the corresponding holder independently of others of said holders.

20. The resist processing method according to claim 12, wherein each of said second and third carrying means has two handling arms, each connected to a corresponding holder for holding a sheet of substrate, the handling arms each for moving the corresponding holder independently of the other holder.

21. The resist processing method according to claim 18, wherein the holder of said first carrying means includes plural pins for supporting the substrate thereon while partly contacting an underside of said substrate.

22. The resist processing method according to claim 19, wherein each of said holders of said second carrying means includes plural pins for supporting the substrate thereon while partly contacting an underside of said substrate.

23. The resist processing method according to claim 12, wherein said waiting section includes means for baking substrates.

24. The resist processing method according to claim 12, wherein said waiting section includes means for cooling substrates.

25. The resist processing method according to claim 12, wherein said waiting section includes means for measuring a thickness of resist film on each substrate to confirm whether or not the film thickness thus measured is correct.

26. The resist processing method according to claim 13, wherein the substrate is resist-coated at the first process section and exposed and developed at the second process section.

27. The resist processing method according to claim 13, wherein each substrate is resist-coated at the second process section and exposed and developed at the first process section.

28. A resist processing method comprising:
taking a substrate out of a first housing section for housing substrates which have not been processed at a resist process section including plural units arranged on both sides of a passage on which a second carrying means having two holders run and transferring the substrate to a delivering/receiving means, by one holder of said second carrying means;

carrying another substrate, which has been processed by a first unit at the resist process section, out of the first unit by the other holder of said second carrying means, while carrying the substrate, which has not been processed yet but held by one holder of the second carrying means, into the first unit by one holder of said second carrying means;

carrying the substrate, which has been processed by a second unit at the resist process section, out of the second unit by one holder of said second carrying means, while carrying the substrate, which has been processed by a first unit, into the second unit by the other holder of said second carrying means;

carrying the substrate which has been processed by the second unit and transferring the substrate to the delivering/receiving means by one holder of said second carrying means; and receiving the substrate from the delivering/receiving means and housing the substrate into the second housing section by the first carrying means.

29. The resist processing method according to claim 1, further comprising the step of positioning the substrate relative to the first and second carrying means by the delivering/receiving means.

30. The resist processing method according to claim 1, wherein said substrate is a semiconductor wafer.

* * * * *